United States Patent
Ou (10) Patent No.: US 10,444,786 B2
(45) Date of Patent: Oct. 15, 2019

(54) MESH-BASED CLOCK DISTRIBUTION FOR LOW POWER AND HIGH SPEED SYNCHRONIZED APPLICATIONS

(71) Applicant: MediaTek Singapore Pte. Ltd., Singapore (SG)

(72) Inventor: Shih-Kuang Ou, San Jose, CA (US)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/151,139

(22) Filed: Oct. 3, 2018

(65) Prior Publication Data

US 2019/0235568 A1    Aug. 1, 2019

Related U.S. Application Data

(60) Provisional application No. 62/622,218, filed on Jan. 26, 2018.

(51) Int. Cl.
| | |
|---|---|
| *G06F 1/10* | (2006.01) |
| *H03K 17/00* | (2006.01) |
| *G06F 1/12* | (2006.01) |
| *H03K 17/693* | (2006.01) |
| *H03K 19/0175* | (2006.01) |

(52) U.S. Cl.
CPC ............ *G06F 1/10* (2013.01); *G06F 1/12* (2013.01); *H03K 17/005* (2013.01); *H03K 17/693* (2013.01); *H03K 19/017509* (2013.01)

(58) Field of Classification Search
CPC . G06F 1/10; G06F 1/12; G06F 17/505; G06F 2217/62; G06F 17/5077; G06F 2217/84; G06F 17/5072; G06F 1/32; G06F 17/5068; G06F 17/5031; G06F 1/06; G06F 17/5045; H03K 19/096; H03K 19/1774; H03K 19/018585; H03K 5/05; H03K 5/15; H03K 23/40; H03K 23/58; H03K 19/01728; H03K 19/01855; G01R 31/318552; G11C 7/222; H03H 11/265
See application file for complete search history.

(56) References Cited

U.S. PATENT DOCUMENTS

| | | | | |
|---|---|---|---|---|
| 6,204,713 | B1* | 3/2001 | Adams ...................... | G06F 1/10 327/293 |
| 6,426,649 | B1* | 7/2002 | Fu ..................... | H03K 19/17736 326/38 |
| 6,879,185 | B2* | 4/2005 | Swami ............... | H03K 19/1774 326/101 |
| 7,475,374 | B1* | 1/2009 | Johnson ................ | G06F 17/505 716/115 |

(Continued)

*Primary Examiner* — Vibol Tan
(74) *Attorney, Agent, or Firm* — Tong J. Lee (57) ABSTRACT

A sectioned mesh which includes multiple sections to distribute a clock signal to logic gates. Each section includes interconnected wires operable to deliver the clock signal to the logic gates. The interconnected wires in a same section are shorted together and the interconnected wires in different sections are not shorted. The sectioned mesh also includes clock input structure connecting to one or more contact points in an input section of the sectioned mesh. The sectioned mesh also includes multiple groups of repeater drivers to repower the clock signal. Different groups are in different sections, and each group in a respective section receives the clock signal from a neighboring section.

20 Claims, 6 Drawing Sheets

(56) References Cited

U.S. PATENT DOCUMENTS

| | | | | |
|---|---|---|---|---|
| 7,486,111 | B2* | 2/2009 | Madurawe | H03K 19/17736 326/38 |
| 7,612,599 | B2* | 11/2009 | Motoyoshi | G06F 1/10 327/295 |
| 7,719,316 | B2* | 5/2010 | Chueh | G06F 1/10 326/101 |
| 7,741,877 | B2* | 6/2010 | Roche | G06F 1/10 326/13 |
| 7,809,971 | B2* | 10/2010 | Shimobeppu | G06F 1/10 327/156 |
| 8,289,063 | B2* | 10/2012 | Chueh | G06F 1/10 327/291 |
| 8,384,436 | B2* | 2/2013 | Peng | G06F 17/505 326/93 |
| 8,629,548 | B1* | 1/2014 | Andreev | G06F 1/10 257/691 |
| 8,704,577 | B2* | 4/2014 | Taskin | G06F 1/10 327/291 |
| 8,994,404 | B1* | 3/2015 | Or-Bach | H03K 19/096 326/41 |
| 9,007,094 | B2* | 4/2015 | Peng | G06F 17/505 326/93 |
| 9,172,377 | B2* | 10/2015 | Peng | G06F 17/505 |
| 9,178,730 | B2* | 11/2015 | Priel | G06F 1/10 |
| 9,419,589 | B2* | 8/2016 | Kumar | G06F 1/10 |
| 9,640,531 | B1* | 5/2017 | Or-Bach | H01L 27/0688 |
| 9,830,418 | B2* | 11/2017 | Peng | G06F 17/505 |
| 2008/0284483 | A1* | 11/2008 | Nakashima | G01R 31/31725 327/293 |
| 2009/0079488 | A1* | 3/2009 | Motoyoshi | G06F 1/10 327/297 |
| 2015/0168992 | A1* | 6/2015 | Choi | G06F 1/12 327/108 |

* cited by examiner

Clock Input Structure 110

Clock Input Structure 110

MESH-BASED CLOCK DISTRIBUTION FOR LOW POWER AND HIGH SPEED SYNCHRONIZED APPLICATIONS

CROSS-REFERENCE TO RELATED APPLICATIONS

This application claims the benefit of U.S. Provisional Application No. 62/622,218 filed on Jan. 26, 2018, the entirety of which is incorporated by reference herein.

TECHNICAL FIELD

Embodiments of the invention relate to a clock distribution mechanism; more specifically, to a power-efficient clock mesh.

BACKGROUND

The on-going demand for high performance electronic systems has driven the need for high-speed digital Very Large Scale Integration (VLSI) chips. VLSI implementations have proceeded in two inter-related directions: higher performance and higher density. As a general rule of thumb, higher performance requires more power. The growth in power consumption comes with a serious cost, including but not limited to: increased failure rates, expansive cooling systems, and decreased chip lifespan. Consequently, power consumption is a predominant challenge in improving modern high performance electronic systems.

Most of the modern VLSI designs are clocked. That is, the operations of logic gates within a VLSI chip are synchronized to act together according to clock signals. It is generally desired that clock signals between synchronized gates have low skew. Clock skew can be characterized as local skew and global skew. Local skew is the clock signal timing difference between logic gates that have timing paths between them within a single clock cycle. Global skew is defined as the clock signal timing difference between logic gates that have no timing paths between them in a single clock cycle.

As long as the gates can keep up within the limit of clock cycle time plus local skew, the higher the clock rate the higher the performance. Unfortunately, as VLSI chip densities increase, the foundry that produces these VLSI chips also introduces more variations into VLSI chips, which is known as the On-Chip Variation (OCV). Due to the OCV, the clock and data signals behave statistically, meaning that in one chip, the clock signal of cycle N happens in X pico-second, in another VLSI chip of same design and process, it can be (X+variation) pico-second. During the design process, a designer will need to add extra margins into VLSI chip designs to account for the OCV. So for a VLSI Clock Delivery Network (CDN), low skew and low OCV between clock delivery points become a high priority design goal. There are various methods for maintaining clock skew, one of which is a clock tree having leaf-level clock drivers spanning an entire mesh structure, with all of the leaf-level clock drivers connected (i.e., short) their outputs together. This mesh structure (on which all of the clock signals shorted together) is referred herein as a traditional clock mesh or traditional mesh. The leaf-level clock drivers are the clock delivery points to the gates receiving the clock signals.

A traditional mesh lowers local skew and OCV at the same time. By shorting the leaf-level clock drivers, a traditional mesh is able to average out the skew between these leaf-level clock drivers.

The leaf-level clock drivers in a traditional mesh drive an entire wire mesh and the registers underneath the mesh. The traditional mesh structure reduces individual driver variation; however, when clock meshes drive a large amount of loading, more individual drivers are needed in order to maintain the correct electronic property of clock transitions. As a result, short-circuit current between clock drivers goes up drastically. Short-circuit current occurs when a clock driver and its neighboring driver change state at different times. Since these clock drivers have their output connected to each other, when one driver's output pull up faster than its neighbor, the current will flow directly from this driver's output into its neighbor's output pins. If this driver's output pulls up slower than its neighbor, the short-circuit current goes the other way. Either way, a designer induces more short-circuit power consumption to lower the OCV.

Peak power consumption is sometimes a bigger issue than short-circuit power since modern VLSI can only support a limited amount of power while function correctly. Peak power of modern synchronous VLSI normally occurs when a maximum number of transistors switch within a short period of time. Since transistors switch right after their clock signal is activated, peak power is highly correlated to the global skew. With a tighter (i.e., smaller) global skew, there is a higher possibility of a larger total number of transistor switching together hence higher peak power consumption. Peak current density is a function of global skew.

Traditional clock delivery structures do not address OCV, clock skew, short-circuit power consumption and peak power consumption all at the same time. Thus, a circuit designer sometimes is forced to choose between higher full chip peak power consumption and higher clock speed.

SUMMARY

In one embodiment, a sectioned mesh is provided for distributing a clock signal. The sectioned mesh comprises multiple sections, each section including interconnected wires operable to deliver the clock signal to logic gates. The interconnected wires in a same section are shorted together and the interconnected wires in different sections are not shorted. The sectioned mesh further comprises a clock input structure connecting to one or more contact points in an input section of the sectioned mesh. The sectioned mesh further comprises multiple groups of repeater drivers to repower the clock signal. Different groups are in different sections, and each group in a respective section receives the clock signal from a neighboring section.

In another embodiment, a method is provided for distributing a clock signal by a sectioned mesh. The method comprises receiving the clock signal from a clock input structure at one or more contact points in an input section of the sectioned mesh. The sectioned mesh is partitioned into the input section and multiple sections. Each section includes a corresponding group of repeater drivers. The method further comprises, at each group of repeater drivers, receiving the clock signal from a neighboring section to repower the clock signal. Each section includes interconnected wires which are operable to deliver the clock signal to logic gates. The interconnected wires in a same section are shorted together, and the interconnected wires in different sections are not shorted.

Other aspects and features will become apparent to those ordinarily skilled in the art upon review of the following description of specific embodiments in conjunction with the accompanying figures.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the present invention are directed to lowering both the total power consumed by a clock distribution network (CDN) and the peak power of an integrated circuit (IC) chip, such as a VLSI chip. The CDN includes a low-power sectioned mesh, which is a mesh structure including multiple sections. The sectioned mesh improves On-Chip Variation (OCV) and local clock skew. The OCV is reduced dramatically inside each section due to the mesh structure shorting the section drivers in the same section. Furthermore, the OCV is reduced dramatically between adjacent sections due to the parallel driving structure that statistically reduces correlated and un-correlated variations.

With respect to power consumption, a sectioned mesh provides improved damping of any load imbalance between sections, thereby reducing the total mesh power. The sectioned mesh structure has a higher tolerance for load imbalance between adjacent sections, because the repeater drivers in each section form a barrier between the sections. That is, a first group of repeater drivers that drive a first load in a first section are not affected by a second load in a second section, because a second group of repeater drivers that drive the second load in the second section form a barrier for the second section. Moreover, a sectioned mesh reduces the RC exposure of each repeater driver, thus the output loading of each repeater driver is much smaller than traditional meshes.

Moreover, a sectioned mesh reduces chip peak power by increasing the global skew, as the clock pulses are delivered to logic gates in different mesh sections at slightly different times. The global skew is defined as the clock signal timing difference between those logic gates that have no timing paths between them in a single clock cycle. Taking into consideration the clock frequency and the signal transmission speed, the global skew in a sectioned mesh may be defined as the clock timing difference between two repeater drivers with a timing path over a predefined distance, e.g., 500 um, between them. The increased global skew, in practice, can be well tolerated, because logic gates that are apart beyond the given distance may use delay registers in between to maintain synchronization.

The local skew in a sectioned mesh, which is the clock timing difference between two repeater drivers with a timing path below the predefined distance between them is smaller than traditional clock trees and comparable to traditional meshes. In some embodiments, clock skew between locations that are in the same section or in two adjacent sections is local skew, and clock skew between locations that are two or more sections apart is global skew. Global skew gradually increases with, and is proportional to, the distance between two locations across two or more sections.

Additionally, a sectioned mesh reduces short-circuit power, because the number of repeater drivers that are shorted together (that is, the number of repeater drivers in each section) is reduced compared to traditional mesh structures. The more other repeater drivers to which a repeater driver is shorted, there is a higher possibility that the amount of short-circuit power increases.

Hence, a sectioned mesh structure comprehensively addresses clock skew, OCV, chip peak power and short-circuit power. The power consumption of a sectioned mesh is an order of magnitude smaller than a traditional mesh, and is smaller than a clock tree generated by traditional commercial tools.

In the descriptions herein, the term "zero-skew" in connection with the clock signals input to the mesh structure refers to the clock signals generated by a clock source (e.g., PLL) and traverse equal path lengths to the mesh input points. The mesh input points are also referred to as "contact points." The word "zero" refers to the negligible, if any, amount of skew which may be introduced by Process, Voltage and Temperature (PVT) conditions of an IC chip.

Figure 1:
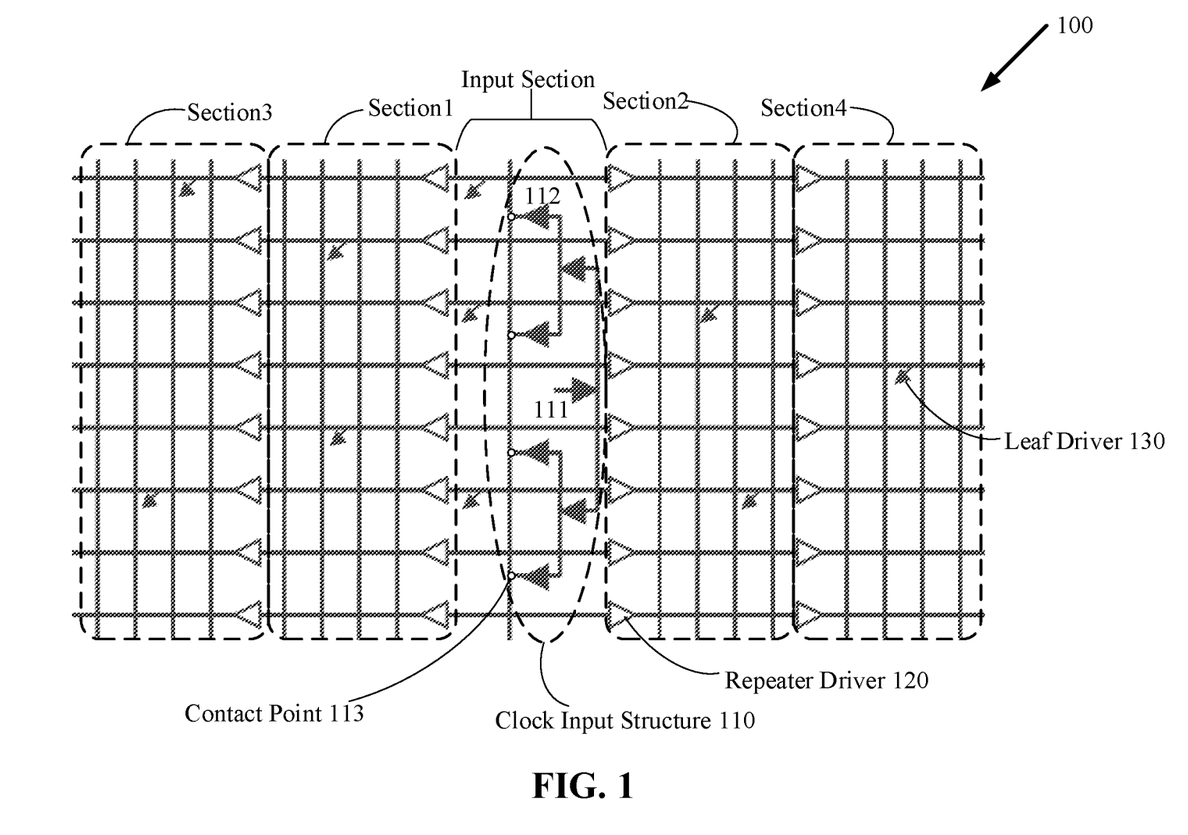
FIG. 1 illustrates a sectioned mesh according to a first embodiment.

FIG. 1 is a schematic diagram illustrating a sectioned mesh 100 according to one embodiment. The sectioned mesh 100 includes horizontal wires and vertical wires, which form a wire mesh to (at least partially) cover an IC chip and distributes clock signals across the IC chip. All of the intersections between the horizontal wires and the vertical wires are connected (i.e., shorted). The sectioned mesh 100 receives a clock input from a clock input structure 110 formed by interconnected clock drivers (colored black and horizontally oriented as shown). In one embodiment, the clock input structure 110 has a tree structure (e.g., a balanced tree structure) in which every tree leaf is equally distant from the tree root. The example of FIG. 1 shows a tree root 111 connected to two internal tree nodes, which are connected to four tree leaves 112. The tree root 111 may be connected to a clock source, such as a PLL circuit (not shown). At each node of the tree, including the tree root 111, the internal nodes and the tree leaves 112, is a clock driver to drive the clock signals to the sectioned mesh 100. The tree leaves 112 form a contact with the sections at a number of contact points 113. All of the clock drivers at the tree leaves 112 (more specifically, the contact points 113) are shorted together. The clock input structure 110 is also referred to a zero-skew input because the clock signal transmission path has the same length from the tree root 111 to every tree leaf. Additional details about the clock input structure 110 is provided later with reference to FIG. 8.

The sectioned mesh 100 includes a plurality of sections; e.g., input section, Section1, Section2, Section3 and Section4. The boundary of each section is marked by a group of repeater drivers 120, also referred to as section drivers (colored white and horizontally oriented as shown). Each group of repeater drivers 120 repower the received clock signal and distribute the repowered clock signal to the loads in its section. The repeater drivers 120 in each section are shorted together via the wires in its section to drive the loads in its section. The repeater drivers 120 in different sections are not shorted together. The repeater drivers 120 in a section do not drive loads in another section. In FIG. 1, the sections (Section1 and Section2, Section3 and Section4) extend from both sides of the input section in a horizontal direction and the repeater drivers in each section are aligned in a vertical direction. All of the interconnected wires are operable to deliver the clock signal to logic gates. The interconnected wires in the same section are shorted together and the interconnected wires in different sections are not shorted.

The sectioned mesh 100 is also connected to a plurality of leaf drivers 130 (colored black and diagonally oriented as shown). Each leaf driver 130 is a clock distribution point for the clocked circuit components on the chip. The leaf drivers 130 can be deployed in any of the sections as needed. In one embodiment, a leaf driver 130 may be connected to a clock gate which can be opened to stop the connecting circuitry from receiving the clock signal and closed to connect the circuitry to the clock signal.

As each section occupies only a fraction of the chip, and each group of repeater drivers 120 are responsible for driving the load in only one section, these repeater drivers 120 can be smaller and consume less power than if the group needs to drive the entire chip. The clock skew in each section is negligible because all repeater drivers 120 in a section, as well as all wire intersection points in the section, are shorted. A repeater driver 120 introduces a delay in a clock signal that passes through it. Thus, the more sections there are between two points on the sectioned mesh 100, the more global delay between those two points. However, as mentioned before, the clock peak power is reduced because of the increased global skew. The total power consumption is also reduced because there are fewer repeater drivers 120 shorted together in each section and thus less short-circuit power wasted.

FIGS. 2-7 illustrate alternative embodiments of a sectioned mesh. In the following description of FIG. 2-7, the location of the clock input structure 110 is referred to as the input section. The other sections (referred to as "sections") have different alignments and orientations with respect to the input section in different embodiments. All of the sectioned meshes in FIGS. 2-7 has the same low power properties as the sectioned mesh 100 in FIG. 1. All of interconnected wires are operable to deliver the clock signal to logic gates. Furthermore, the interconnected wires in the same section are shorted together and the interconnected wires in different sections are not shorted.

Figure 2:
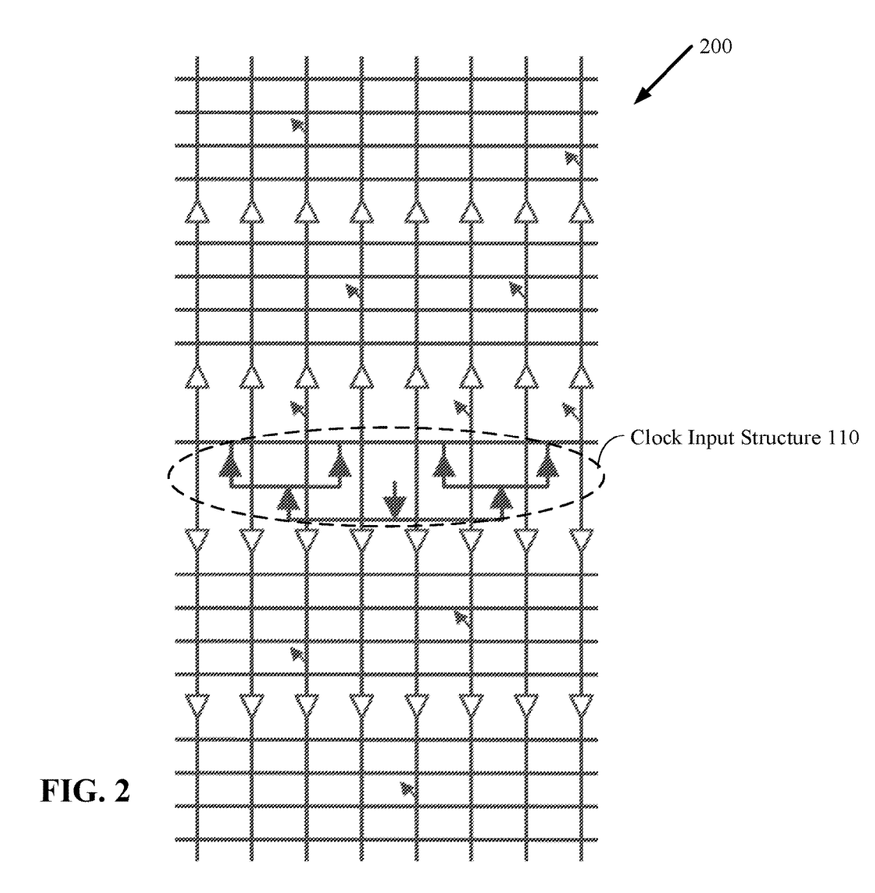
FIG. 2 illustrates a sectioned mesh according to a second embodiment.

FIG. 2 shows a sectioned mesh 200 which is rotated 90 degrees with respect to the sectioned mesh 100 of FIG. 1. That is, the clock input structure 110 of the sectioned mesh 200 is located in the middle of the mesh structure along the horizontal direction. The sections extend from both sides of the input section in a vertical direction and the repeater drivers in each section are aligned in a horizontal direction.

Figure 3:
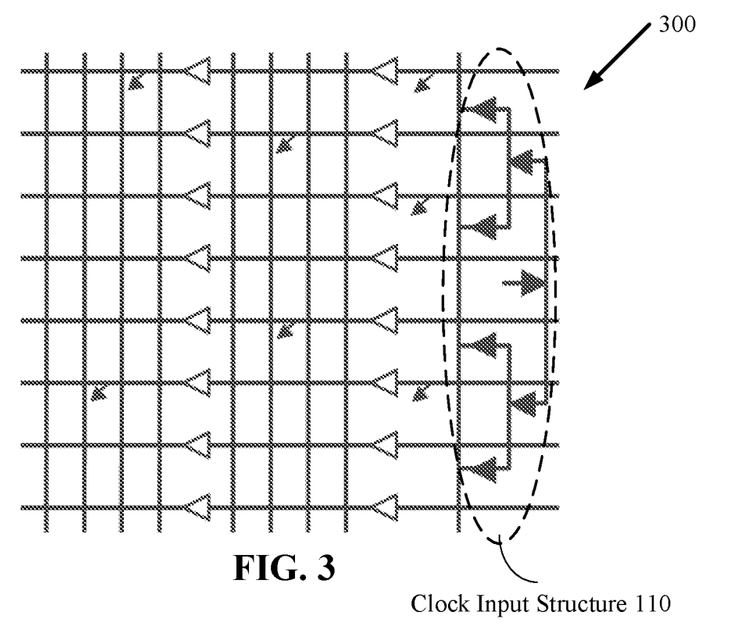
FIG. 3 illustrates a sectioned mesh according to a third embodiment.

FIG. 3 shows a sectioned mesh 300 which is connected to the clock input structure 110 at the rightmost boundary of the mesh structure along the vertical direction. The sections extend from only one side (left side) of the input section in a horizontal direction and the repeater drivers in each section are aligned in a vertical direction.

Figure 4:
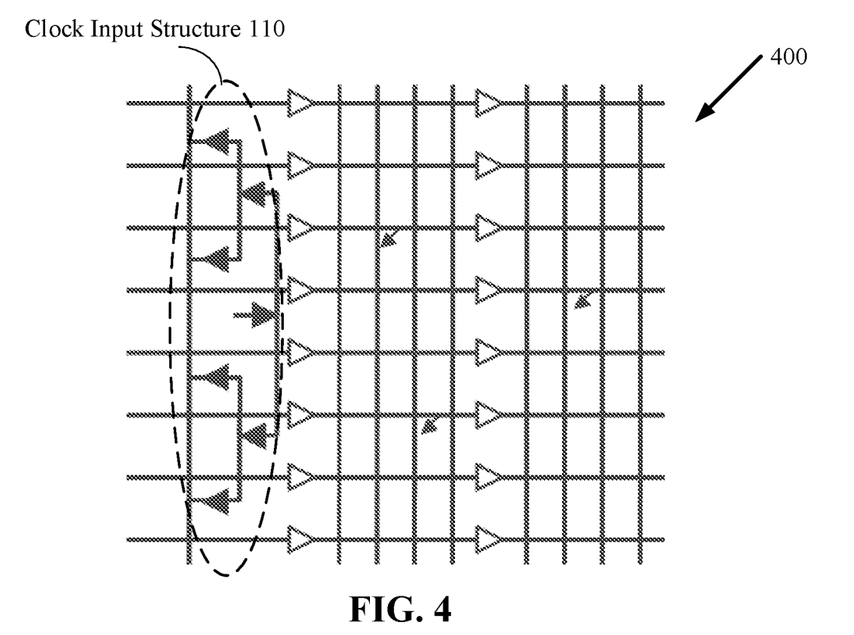
FIG. 4 illustrates a sectioned mesh according to a fourth embodiment.

FIG. 4 shows a sectioned mesh 400 which is connected to the clock input structure 110 at the leftmost boundary of the mesh structure along the vertical direction. The sections extend from only one side (right side) of the input section in a horizontal direction and the repeater drivers in each section are aligned in a vertical direction.

Figure 5:
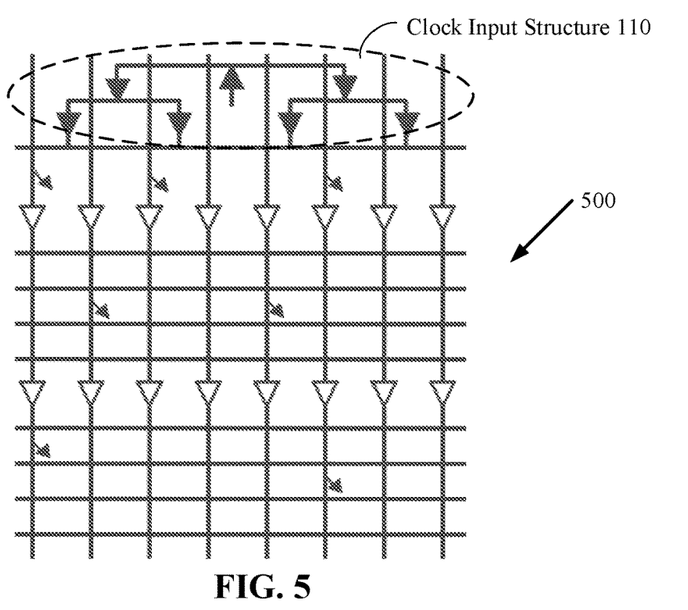
FIG. 5 illustrates a sectioned mesh according to a fifth embodiment.

FIG. 5 shows a sectioned mesh 400 which is connected to the clock input structure 110 at the top boundary of the mesh structure along the horizontal direction. The sections extend from only one side (bottom side) of the input section in a vertical direction and the repeater drivers in each section are aligned in a horizontal direction.

Figure 6:
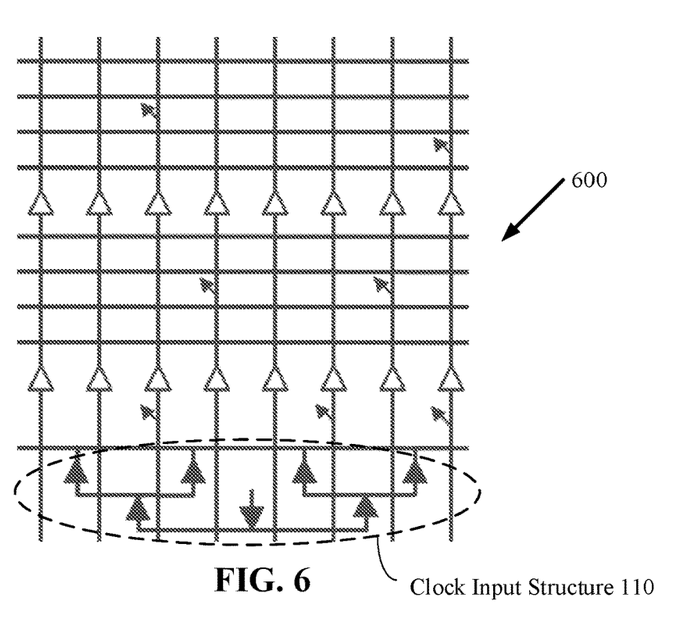
FIG. 6 illustrates a sectioned mesh according to a sixth embodiment.

FIG. 6 shows a sectioned mesh 600 which is connected to the clock input structure 110 at the bottom boundary of the mesh structure along the horizontal direction. The sections extend from only one side (top side) of the input section in a vertical direction and the repeater drivers in each section are aligned in a horizontal direction.

Figure 7:
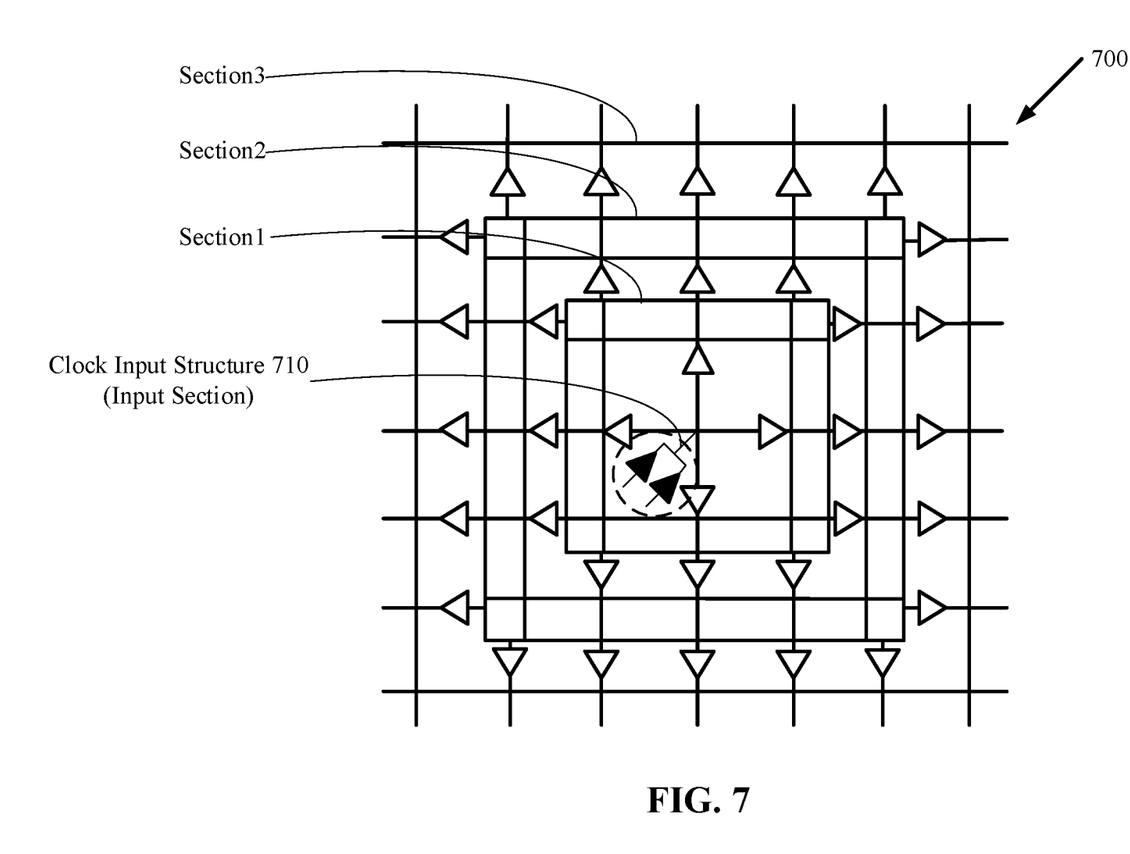
FIG. 7 illustrates a sectioned mesh according to a seventh embodiment.

FIG. 7 shows a sectioned mesh 700 which is connected to a clock input structure 710 at the center. The sections in the sectioned mesh 700 form a ring structure. Similar to the embodiments of FIGS. 1-6, the location of the clock input structure 710 is referred to as the input section. In FIG. 7, the labels for each section (e.g. Section1, Section2 and Section3) point to the top perimeter of the respective sections. The sections in the sectioned mesh 700 extend from the perimeters of the input section radially outwards, and the repeater drivers in an outer section (e.g., Section2) surround the perimeters of an inner section (e.g., Section1). All of the wire intersections shown in FIG. 7 are connected (i.e., shorted). The repeater drivers in the same section are shorted, and the repeater drivers in different sections are not shorted.

Figure 8:
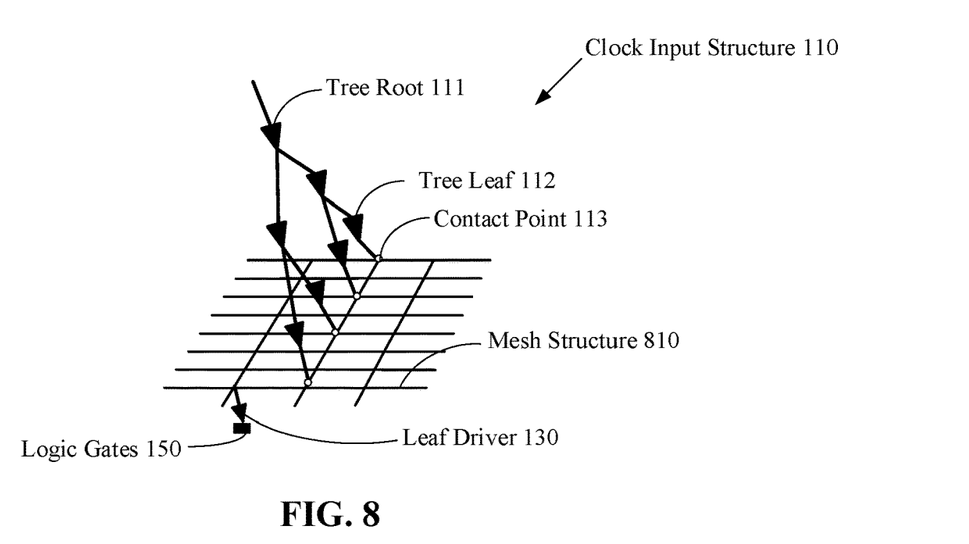
FIG. 8 illustrates a clock input structure according to one embodiment.

FIG. 8 illustrates a 3-D schematic diagram of the clock input structure 110 according to one embodiment. It is noted that the 3-D diagram is meant to more clearly show and describe the clock input structure 110, and does not represent the actual layout of the input clock structure 110 on an IC chip. The same concept shown in FIG. 8 and described herein applies to the clock input structure 710 of FIG. 7. The clock input structure 110 delivers clock signals from the tree root 111 to the tree leaves 112, and further to a mesh structure 810. The mesh structure 810 may be any of the sectioned meshes described in FIGS. 1-6. FIG. 8 more clearly shows that the contact points 113 between the clock input structure 110 and the sectioned mesh 810 are at the output of the tree leaves 112. FIG. 8 also shows the logic gates 150 driven by the leaf drivers 130 coupled to the mesh structure 810. In contrast, the tree leaf clock drivers of a tradition mesh drive the entire load of the mesh; thus, the capacity of each tree leaf clock driver is higher (e.g. bigger drivers) and the wires are wider (for smaller resistance) than the corresponding components in any of the sectioned meshes described herein. Bigger drivers and wider wires have a negative impact on power consumption.

The sectioned mesh described herein can be configured by chip designers at design time by trading off various design constraints or requirements. To configure a sectioned mesh, a chip designer can change the delay of some sections by changing the size of section components, (e.g., the size of section drivers, the size of mesh wires, and/or the distance between section drivers) to increase or decrease the global skew and the local skew. By increasing the global skew, chip peak dynamic power is reduced, so the silicon can use cheaper packaging and other supporting systems. However, the increased global skew may make some timing critical paths harder to close if these paths happen to be hit by the global skew increment. By decreasing the global skew, a chip designer can reduce the potential timing criticality with the cost of increment of the peak power. Thus, chip designers can trade one design element with another to obtain a sectioned mesh with optimal characteristics.

Figure 9:
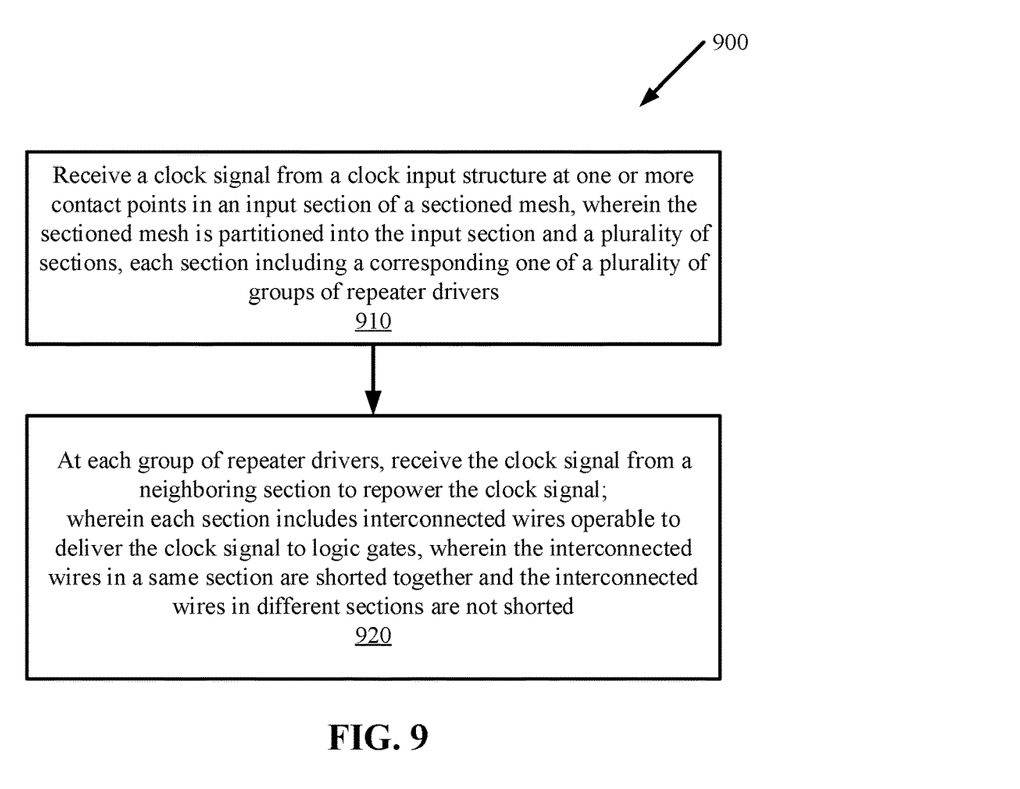
FIG. 9 is a flow diagram illustrating a method for distributing a clock signal by a sectioned mesh according to one embodiment.

FIG. 9 is a flow diagram illustrating a method 900 for distributing a clock signal by a sectioned mesh according to one embodiment. The method 900 may be performed by any of the sectioned meshes in FIGS. 1-7, as well as any variations thereof.

The method 900 begins at step 910 with the sectioned mesh receiving a clock signal from a clock input structure at one or more contact points in an input section of the sectioned mesh. More specifically, the sectioned mesh is partitioned into the input section and a plurality of sections, and each section includes a corresponding one of a plurality of groups of repeater drivers. At step 920, each group of repeater drivers receive the clock signal from a neighboring section to repower the clock signal. Each section of the sectioned mesh includes interconnected wires which are operable to deliver the clock signal to logic gates, wherein the interconnected wires in a same section are shorted together, and the interconnected wires in different sections are not shorted.

The operations of the flow diagram of FIG. 9 has been described with reference to the exemplary embodiments of FIGS. 1-7. However, it should be understood that the operations of the flow diagram of FIG. 9 can be performed by embodiments of the invention other than the embodiments of FIGS. 1-7, and the embodiments of FIGS. 1-7 can perform operations different than those discussed with reference to the flow diagram. While the flow diagram of FIG. 9 shows a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A sectioned mesh for distributing a clock signal, comprising:
    a plurality of sections, each section including interconnected wires forming a mesh structure and operable to deliver the clock signal to logic gates, wherein the interconnected wires in each section are shorted together and the interconnected wires in different sections are not shorted;
    a clock input structure connecting to one or more contact points in an input section of the sectioned mesh; and
    a plurality of groups of repeater drivers to repower the clock signal,
    wherein each group of repeater drivers marks a boundary of a corresponding section to receive and repower the clock signal from a neighboring section.

2. The sectioned mesh of claim 1, wherein the sections extend from both sides of the input section in a horizontal direction and the repeater drivers in each section are aligned in a vertical direction.

3. The sectioned mesh of claim 1, wherein the sections extend from both sides of the input section in a vertical direction and the repeater drivers in each section are aligned in a horizontal direction.

4. The sectioned mesh of claim 1, wherein the sections extend from only one side of the input section in a horizontal direction and the repeater drivers in each section are aligned in a vertical direction.

5. The sectioned mesh of claim 1, wherein the sections extend from only one side of the input section in a vertical direction and the repeater drivers in each section are aligned in a horizontal direction.

6. The sectioned mesh of claim 1, wherein the sections extend from perimeters of the input section radially outwards, and the repeater drivers in an outer section surround the perimeters of an inner section.

7. The sectioned mesh of claim 1, wherein the clock input structure is a tree structure that has equal distance from a tree root to each of tree leaves, wherein each tree leaf delivers the clock signal to one of the contact points.

8. The sectioned mesh of claim 1, wherein each group of repeater drivers form a barrier between two different sections to repower the clock signal passing from one section to another section.

9. The sectioned mesh of claim 1, further comprising leaf drivers to deliver the clock signal from the interconnected wires to the logic gates, wherein the leaf drivers connected to a same section have a substantially zero clock skew.

10. The sectioned mesh of claim 1, wherein clock skew between the different sections is proportional to a distance across the different sections.

11. A method for distributing a clock signal by a sectioned mesh, comprising:
    receiving the clock signal from a clock input structure at one or more contact points in an input section of the sectioned mesh, wherein the sectioned mesh is partitioned into the input section and a plurality of sections, each section including a corresponding one of a plurality of groups of repeater drivers which marks a boundary of the section; and
    at each group of repeater drivers, receiving the clock signal from a neighboring section to repower the clock signal;
    wherein each section includes interconnected wires which form a mesh structure and are operable to deliver the clock signal to logic gates,
    wherein the interconnected wires in each section are shorted together and the interconnected wires in different sections are not shorted.

12. The method of claim 11, wherein the sections extend from both sides of the input section in a horizontal direction and the repeater drivers in each section are aligned in a vertical direction.

13. The method of claim 11, wherein the sections extend from both sides of the input section in a vertical direction and the repeater drivers in each section are aligned in a horizontal direction.

14. The method of claim 11, wherein the sections extend from only one side of the input section in a horizontal direction and the repeater drivers in each section are aligned in a vertical direction.

15. The method of claim 11, wherein the sections extend from only one side of the input section in a vertical direction and the repeater drivers in each section are aligned in a horizontal direction.

16. The method of claim 11, wherein the sections extend from perimeters of the input section radially outwards, and the repeater drivers in an outer section surround the perimeters of an inner section.

17. The method of claim 11, wherein the clock input structure is a tree structure that has equal distance from a tree root to each of tree leaves, wherein each tree leaf delivers the clock signal to one of the contact points.

18. The method of claim 11, wherein each group of repeater drivers form a barrier between two different sections to repower the clock signal passing from one section to another section.

19. The method of claim 11, wherein two points in a same section have a substantially zero clock skew.

20. The method of claim 11, wherein clock skew between the different sections is proportional to a distance across the different sections.

* * * * *